United States Patent [19]

Koga

[11] Patent Number: 5,727,008
[45] Date of Patent: Mar. 10, 1998

[54] SEMICONDUCTOR LIGHT EMITTING DEVICE, SEMICONDUCTOR LASER DEVICE, AND METHOD OF FABRICATING SEMICONDUCTOR LIGHT EMITTING DEVICE

[75] Inventor: Kazuyuki Koga, Yawata, Japan

[73] Assignee: Sanyo Electric Co., Ltd., Moriguchi, Japan

[21] Appl. No.: 649,287

[22] Filed: May 17, 1996

[30] Foreign Application Priority Data

| May 19, 1995 | [JP] | Japan | 7-121642 |
| Apr. 30, 1996 | [JP] | Japan | 8-109077 |
| May 13, 1996 | [JP] | Japan | 8-117965 |

[51] Int. Cl.$^6$ ............................................... H01S 3/02
[52] U.S. Cl. ........................... 372/43; 257/77; 372/45
[58] Field of Search ............... 272/45, 44, 43; 257/77

[56] References Cited

U.S. PATENT DOCUMENTS

| 4,912,063 | 3/1990 | Davis et al. | 437/100 |
| 5,008,735 | 4/1991 | Edmond et al. | 357/74 |
| 5,027,168 | 6/1991 | Edmond | 357/17 |
| 5,187,547 | 2/1993 | Niina et al. | 257/77 |
| 5,200,022 | 4/1993 | Kong et al. | 156/612 |
| 5,387,804 | 2/1995 | Suzuki et al. | 257/77 |
| 5,393,993 | 2/1995 | Edmond et al. | 257/77 |
| 5,432,808 | 7/1995 | Hatano et al. | 372/45 |
| 5,585,648 | 12/1996 | Tischler | 372/43 |

FOREIGN PATENT DOCUMENTS

| 60-26079 | 6/1985 | Japan . |
| 2-177577 | 7/1990 | Japan . |
| 4-242985 | 8/1992 | Japan . |

OTHER PUBLICATIONS

Yoshiro Kuga et al, Japanese Journal Applied Physics. vol. 35 (1995) pp.4085–4086 Part 1, No. 8A, Aug. 1995.

Isamu Akasaki et al., Japanese Journal Applied Physics. vol. 34 (1995) L1517–1519 Part 2, No. 11B, Nov. 1995.

Shuji Nakamura et al., Japanese Journal Applied Physics. vol. 35 (1996) pp. L74–76 Part 2, No. 1B, 15 Jan. 1996.

Akito Kuramata et al., International Symposium on Blue Laser and Light Emitting Diodes Chiba University, Japan, Mar. 5–7, 1996.

*Primary Examiner*—Rodney B. Bovernick
*Assistant Examiner*—Ellen Eunjoo Kang
*Attorney, Agent, or Firm*—Armstrong, Westerman, Hattori, McLeland & Naughton

[57] ABSTRACT

A semiconductor light emitting device and a semiconductor laser device having an epitaxial growth layer composed of a III–V group nitride semiconductor. An AlN buffer layer, an n-type GaN intermediate layer, an n-type $Al_{1-x}Ga_xN$ cladding layer, an $In_{1-y}Ga_yN$ active layer and a p-type $Al_{1-x}Ga_xN$ cladding layer, and a p-type GaN contact layer are successively formed on an n-type 6H—SiC substrate having a {0001} crystal growth plane. A p-side electrode is formed on the upper surface of the p-type GaN contact layer, and an n-side electrode is formed on the lower surface of the n-type 6H—SiC substrate, after which the n-type 6H—SiC substrate is cleaved along a {11$\bar{2}$0} plane to form a cavity facet.

19 Claims, 7 Drawing Sheets

{11$\bar{2}$0} PLANE

{10$\bar{1}$0} PLANE

{10$\bar{1}$0} PLANE

{112̄0} PLANE

○ :Si ATOM
◉ :C ATOM

{10$\bar{1}$0} PLANE

○ :Ga ATOM
● :N ATOM

{11$\bar{2}$0} PLANE

○ :Ga ATOM

◉ :N ATOM

SEMICONDUCTOR LIGHT EMITTING DEVICE, SEMICONDUCTOR LASER DEVICE, AND METHOD OF FABRICATING SEMICONDUCTOR LIGHT EMITTING DEVICE

BACKGROUND OF THE INVENTION

1. Field of the Invention

The present invention relates to a semiconductor light emitting device and a semiconductor laser device having an epitaxial growth layer composed of a III–V group nitride semiconductor such as GaN (gallium nitride), AlN (aluminum nitride) or InN (indium nitride) or their mixed crystal (hereinafter referred to as a nitride system semiconductor), and a method of fabricating the semiconductor light emitting device.

2. Description of the Related Art

A nitride system semiconductor having a direct transition type band structure uses a material of a semiconductor light emitting device such as a light emitting diode or a semiconductor laser device emitting light in a short wavelength because it has a wide forbidden band. Since substrates of nitride system semiconductor are not available, however, a nitride system semiconductor layer is epitaxially grown on a substrate composed of the other material in fabricating the semiconductor light emitting device.

For example, a light emitting diode having an InGaN/AlGaN double hetero structure formed on a sapphire ($Al_2O_3$) substrate is disclosed in Applied Physics Letter Vol. 64 (13), 28 Mar., 1994, pp. 1687–1689. The light emitting diode can emit light in blue.

However, the sapphire substrate has no cleavage plane, so that devices formed on a sapphire wafer cannot be separated by cleavage. On the other hand, in the semiconductor laser device, cavity facets having optical flatness are required. Since the sapphire substrate has no cleavage plane as described above, however, it is difficult to form a cavity facet on an active layer composed of a nitride system semiconductor formed on the sapphire substrate.

For example, it is possible to form a cavity facet using a special etching method such as RIE (reactive-ion etching). However, the cavity facet formed by etching is inferior in flatness, and is not suitable for mass-production. Consequently, the etching is not very suitable for formation of the cavity facet of the semiconductor laser device.

In the conventional nitride system semiconductor light emitting device formed on the sapphire substrate, a cavity facet for simulated emission and amplification cannot be thus formed using a cleaving method. Therefore, a semiconductor laser device stably emitting light in blue cannot be realized.

Furthermore, the sapphire substrate is an insulator, and there is no conductivity in the vertical direction of the semiconductor light emitting device, whereby no electrode can be formed on the lower surface of the sapphire substrate. Consequently, the structure of the semiconductor light emitting device becomes complicated. It is also difficult to cause a current to flow perpendicularly to the active layer of the semiconductor laser device to cause lasing.

SUMMARY OF THE INVENTION

An object of the present invention is to provide a nitride system semiconductor light emitting device which can be fabricated by cleavage and whose device structure is not complicated.

Another object of the present invention is to provide a nitride system semiconductor laser device whose cavity facet can be fabricated by cleavage and which can stably lase.

Still another object of the present invention is to provide a method of fabricating a nitride system semiconductor light emitting device, in which a facet or a side surface which is superior in flatness can be formed.

A semiconductor light emitting device according to the present invention comprises a silicon carbide substrate, and an epitaxial growth layer formed on the silicon carbide substrate and composed of a nitride system semiconductor including at least one of gallium, aluminum and indium. The semiconductor light emitting device has a pair of facets or a pair of side surfaces which is formed of a ($11\bar{2}0$) plane or a plane equivalent to the ($11\bar{2}0$) plane of the silicon carbide substrate and the epitaxial growth layer.

In this case, the pair of facets or the pair of side surfaces is formed of a cleavage plane.

The ($11\bar{2}0$) plane or the plane equivalent to the ($11\bar{2}0$) plane of the silicon carbide substrate has cleavable characteristics and has optical flatness. If a layer composed of a nitride system semiconductor including at least one of gallium, aluminum and indium is epitaxially grown on the silicon carbide substrate, crystal growth is performed in the same plane direction as that of the silicon carbide substrate. Consequently, the silicon carbide substrate, together with the epitaxial growth layer formed thereon, can be cleaved along the ($11\bar{2}0$) plane or the plane equivalent thereto. Therefore, the pair of facets or the pair of side surfaces of the semiconductor light emitting device can be formed by cleavage.

When the silicon carbide substrate is cleaved along the ($11\bar{2}0$) plane or the plane equivalent thereto, a flat face appears at an atomic level or a macroscopic level. Consequently, the semiconductor light emitting device can emit light stably and efficiently.

It is preferable that the epitaxial growth layer is formed on a (0001) plane or a plane equivalent to the (0001) plane of the silicon carbide substrate.

Furthermore, the silicon carbide substrate includes impurity elements for providing conductivity. The semiconductor light emitting device further comprises a first electrode formed on the upper surface of the epitaxial growth layer, and a second electrode formed on the lower surface of the silicon carbide substrate.

Since conductivity is provided to the silicon carbide substrate by adding the impurity elements, the silicon carbide substrate has conductivity in the vertical direction of the semiconductor light emitting device, whereby the device structure thereof is simplified.

Particularly, it is preferable that the nitride system semiconductor is composed of GaN, InN, AlN or a compound of N and one or a plurality of elements selected from a group consisting of Ga, In and Al.

Furthermore, the silicon carbide substrate is of a hexagonal system, and the plane equivalent to the ($11\bar{2}0$) plane of the silicon carbide substrate and the epitaxial growth layer is a ($2\bar{1}\bar{1}0$) plane, a ($1\bar{2}10$) plane, a ($\bar{1}\bar{1}20$) plane, a ($\bar{2}110$) plane or a ($\bar{1}2\bar{1}0$) plane.

The silicon carbide substrate is of a cubic system, and the plane equivalent to the ($11\bar{2}0$ plane of the silicon carbide substrate is a {101} plane.

A semiconductor laser device according to another aspect of the present invention comprises a silicon carbide substrate, and an epitaxial growth layer formed on the silicon carbide substrate and composed of a nitride system semiconductor including at least one of gallium, aluminum and indium. The semiconductor laser device has a pair of cavity facets which is formed of a (11$\bar{2}$0) plane or a plane equivalent to the (11$\bar{2}$0) plane of the silicon carbide substrate and the epitaxial growth layer.

In this case, the pair of cavity facets is formed of a cleavage plane.

Furthermore, a pair of side surfaces of the epitaxial growth layer perpendicular to the pair of cavity facets is formed of a {10$\bar{1}$0} plane.

When the silicon carbide substrate is cleaved along the (11$\bar{2}$0) plane or the plane equivalent thereto, a flat face is realized at an atomic level and a macroscopic level. By utilizing a flat cleavage plane as the cavity facets, therefore, the semiconductor laser device stably lases.

Particularly, it is desirable that the epitaxial growth layer is formed on a (0001) plane of the silicon carbide substrate or a plane equivalent to the (0001) plane.

Furthermore, the silicon carbide substrate includes impurity elements for providing conductivity. The semiconductor laser device further comprises a first electrode formed on the upper surface of the epitaxial growth layer, and a second electrode formed on the lower surface of the silicon carbide substrate.

Consequently, a current can be injected perpendicularly to an active layer, whereby the semiconductor laser device can be also easily fabricated.

It is preferable that the nitride system semiconductor is composed of GaN, InN, AlN or a compound N and one or a plurality of elements selected from a group consisting of Ga, In and Al.

Furthermore, the silicon carbide substrate is of a hexagonal system, and the plane equivalent to the (11$\bar{2}$0) plane of the silicon carbide substrate and the epitaxial growth layer is a (2$\bar{1}\bar{1}$0) plane, a (1$\bar{2}$10) plane, a ($\bar{1}\bar{1}$20) plane, a ($\bar{2}$110) plane or a ($\bar{1}$2$\bar{1}$0) plane.

The silicon carbide substrate is of a cubic system, and the plane equivalent to the (11$\bar{2}$0) plane of the silicon carbide substrate is a {101} plane.

Furthermore, the epitaxial growth layer comprises a first cladding layer, an active layer formed on the first cladding layer, and a second cladding layer formed on the active layer.

A method of fabricating a semiconductor light emitting device according to still another aspect of the present invention comprises the steps of forming on a silicon carbide substrate an epitaxial growth layer composed of a nitride system semiconductor including at least one of gallium, aluminum and indium, and forming a pair of facets or a pair of side surfaces of the semiconductor light emitting device by cleaving the silicon carbide substrate and the epitaxial growth layer along a (11$\bar{2}$0) plane or a plane equivalent to the (11$\bar{2}$0) plane of the silicon carbide substrate.

It is preferable that the epitaxial growth layer is formed on a (0001) plane or a plane equivalent to the (0001) plane of the silicon carbide substrate.

The silicon carbide substrate includes impurity elements for providing conductivity. The method of fabricating the semiconductor light emitting device comprises the steps of forming a first electrode on the upper surface of the epitaxial growth layer, and forming a second electrode on the lower surface of the silicon carbide substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Also in the following description of embodiments, GaN, AlN or InN or their mixed crystal is called a nitride system semiconductor.

6H—SiC (silicon carbide) and 4H—SiC are hexagonal system semiconductors, similarly to the nitride system semiconductor which is ordinarily hexagonal system semiconductor, and the lattice constants thereof are approximately equal to that of the nitride system semiconductor. The lattice constant of the 6H—SiC is 3.081 Å. The lattice constant of AlN is 3.112 Å, and the lattice constant of GaN is 3.189 Å. Consequently, the lattice mismatching ratio of AlN to the 6H—SiC is (3.112−3.081)/3.081×100=1.0 [%], and the lattice mismatching ratio of GaN to the 6H—SiC is (3.189−3.081)/3.081×100=3.5 [%].

SiC has a p-type or n-type conductivity type by adding impurity elements. Consequently, SiC is suitable as a substrate of a nitride system semiconductor light emitting device.

Figure 1A:
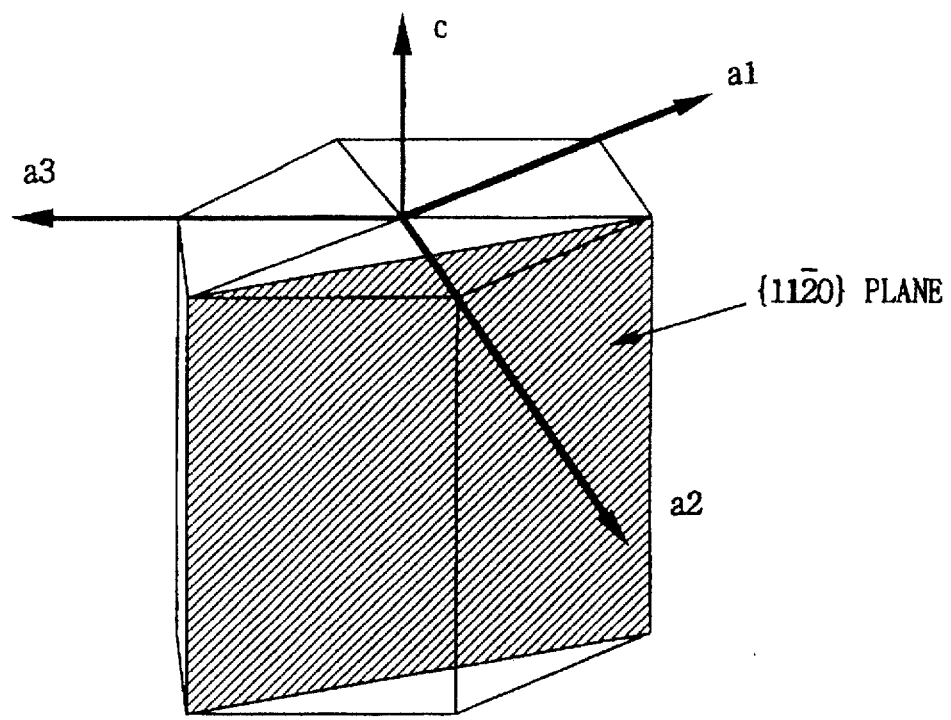
FIG. 1A is a diagram showing a {11$\bar{2}$0} cleavage plane of hexagonal SiC.
Figure 1B:
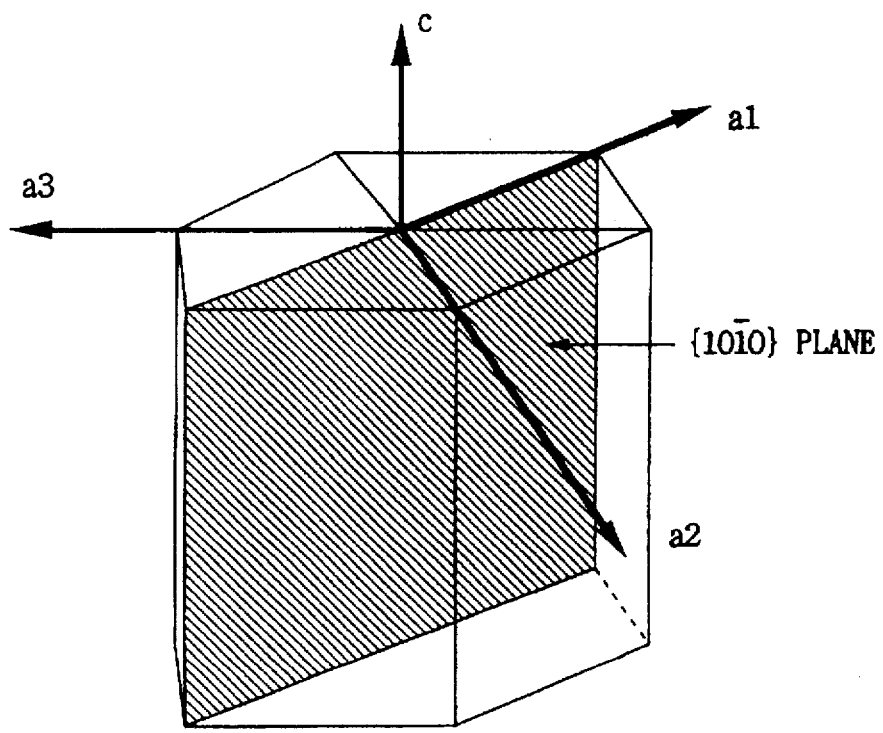
FIG. 1B is a diagram showing a {10$\bar{1}$0} cleavage plane of hexagonal SiC.

FIG. 1A is a diagram showing a {11$\bar{2}$0} cleavage plane of hexagonal SiC. FIG. 1B is a diagram showing a {10$\bar{1}$0} cleavage plane of hexagonal SiC.

The {11$\bar{2}$0} plane of the hexagonal SiC includes a (11$\bar{2}$0) plane and a plane equivalent thereto. The plane equivalent to the (11$\bar{2}$0) plane is a (2$\bar{1}\bar{1}$0) plane, a (1$\bar{2}$10) plane, a ($\bar{1}\bar{1}$20) plane, a ($\bar{2}$110) plane and a ($\bar{1}$2$\bar{1}$0) plane.

In the 6H—SiC or the 4H—SiC, there exist a plurality of crystallographic planes which can be cleaved, for example, a {0001} plane, a {10$\bar{1}$0} plane and a {11$\bar{2}$0} plane. Since the nitride system semiconductor light emitting device is generally formed on the crystallographic plane {0001}, a device structure having the {0001} plane as a cavity facet is difficult. The {0001} plane is equivalent to a (0001) plane or a (000$\bar{1}$) plane.

Consequently, a device structure having as a cavity facet the {11$\bar{2}$0} plane perpendicular to the {0001} plane as shown in FIG. 1A or the {10$\bar{1}$0} plane perpendicular to the {0001} plane as shown in FIG. 1B is feasible.

The 6H—SiC is taken as an example. Atomic arrangements on the {10$\bar{1}$0} plane and the {11$\bar{2}$0} plane are compared with each other.

Figure 2:
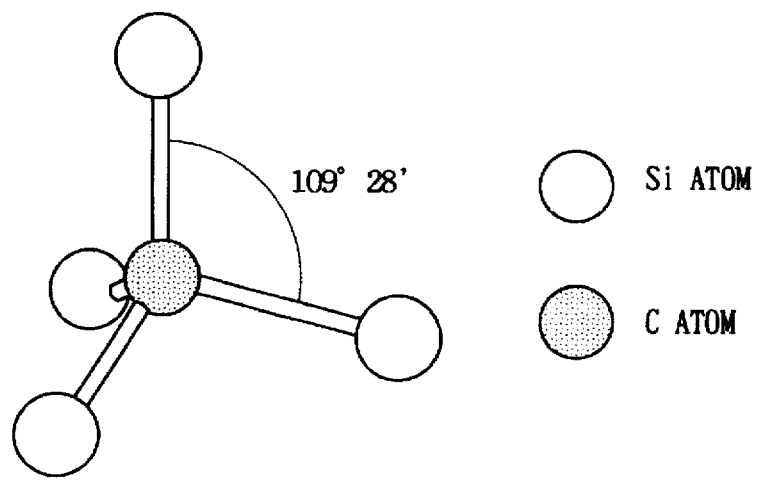
FIG. 2 is a diagram showing the regular tetrahedral structure of a SiC single crystal.

FIG. 2 is a diagram showing the regular tetrahedral structure of an SiC single crystal. As shown in FIG. 2, SiC has a regular tetrahedral structure in which four Si atoms are bound to each other at equal spacing around a C atom. Even if SiC is considered centered around a Si atom, SiC has the same regular tetrahedral structure. By the combination of this basic structure, the crystalline structure of the 6H—SiC, the 4H—SiC, or the like changes.

Figure 3:
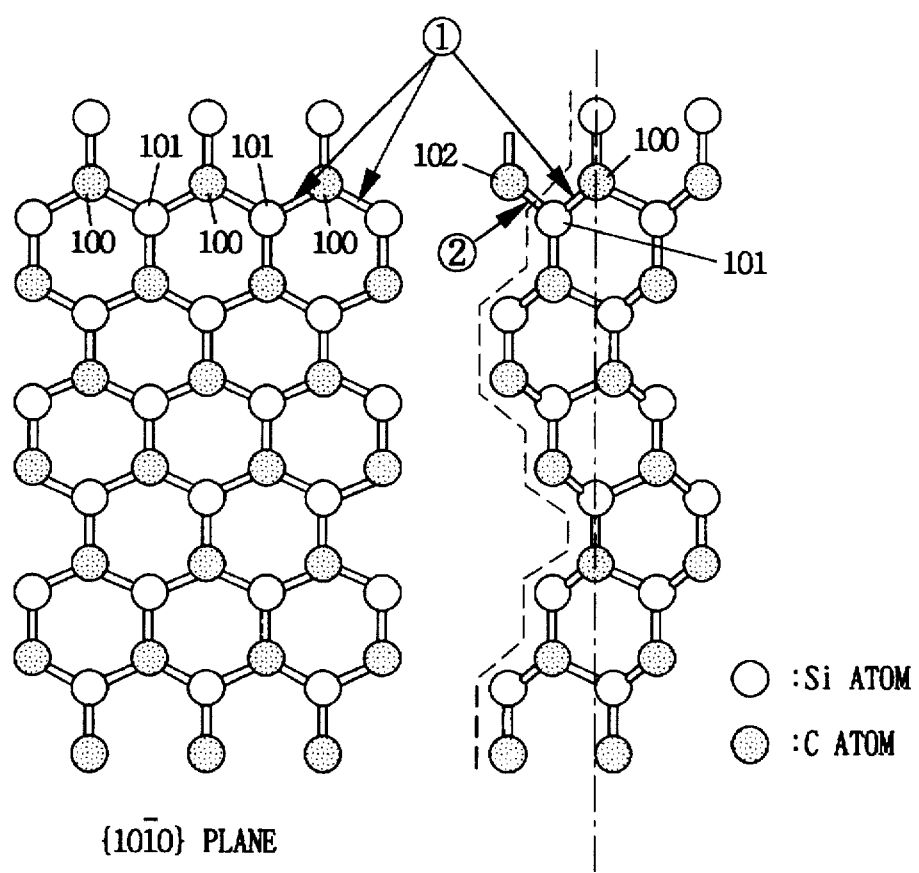
FIG. 3 is a diagram showing an atomic arrangement on a {10$\bar{1}$0} plane of 6H—SiC and an atomic arrangement as viewed from a <11$\bar{2}$0> direction.

A left portion of FIG. 3 illustrates an atomic arrangement on the {10$\bar{1}$0} plane of SiC, and a right portion of FIG. 3 illustrates an atomic arrangement in a case where SiC is viewed from a <11$\bar{2}$0> direction parallel to the {10$\bar{1}$0} plane (for example, a [1$\bar{2}$10] direction parallel to the (10$\bar{1}$0) plane).

Cleavage on the {10$\bar{1}$0} plane is experimentally observed. The {10$\bar{1}$0} plane in the case is indicated by one alternate long and short dot line in the right portion of FIG. 3. In order that the plane appears on the surface, a bonding hand having a weak bond in the vicinity thereof must be cut. Two bonding hands of one Si atom are related to a bond indicated by ①. That is, in order to separate one Si atom 101 from a C atom 100 on the {10$\bar{1}$10} plane, two bonding hands must be cut. Therefore, the bond indicated by ① cannot be easily cut as a whole. On the other hand, one bonding hand of one Si atom is related to a bond indicted by ②. That is, in order to separate a C atom 102 from the Si atom 101, one bonding hand may be cut. Therefore, the bond indicated by ② can be easily cut.

Considering the {10$\bar{1}$10} plane as a whole, the above-mentioned two bond relationships coexist. If a bonding hand which is easily cut continues, an irregular surface is liable to appear, as indicated by a broken line in the right portion of FIG. 3, as viewed from the atomic size. Therefore, inequality exists when the {10$\bar{1}$0} cleavage plane is macroscopically viewed, whereby optical flatness required for the cavity facet of the semiconductor light emitting device is not obtained.

Figure 4:
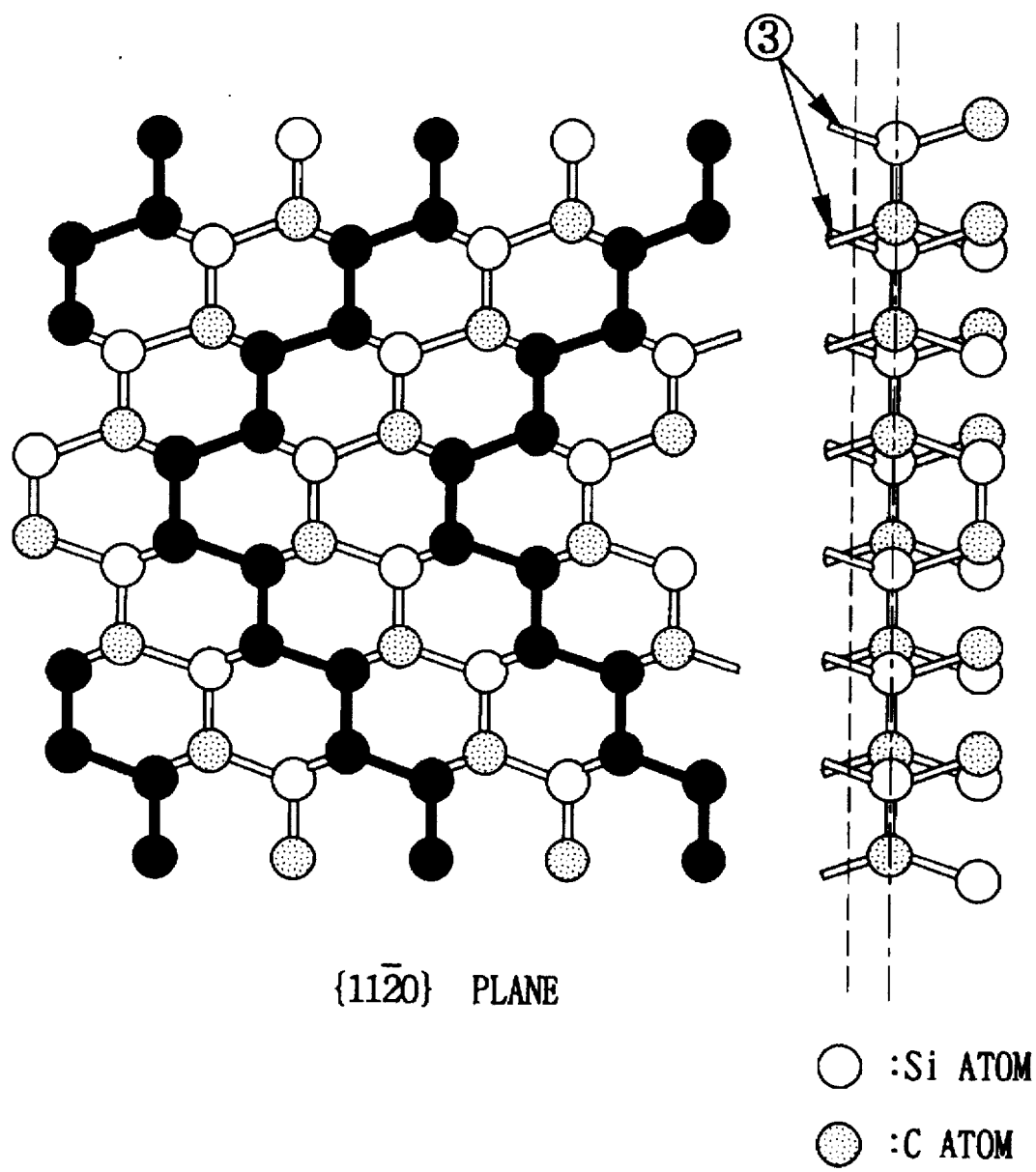
FIG. 4 is a diagram showing an atomic arrangement on a {11$\bar{2}$0} plane of 6H—SiC and an atomic arrangement as viewed from a <10$\bar{1}$0> direction.

A left portion of FIG. 4 illustrates an atomic arrangement on a {11$\bar{2}$0} plane of SiC, and a right portion of FIG. 4 illustrates an atomic arrangement in a case where SiC is viewed from a <10$\bar{1}$0> direction parallel to the {11$\bar{2}$0} plane (for example, a [1$\bar{1}$00] direction parallel to the (11$\bar{2}$0) plane).

The outermost surface of SiC has a flat structure in which Si atoms and C atoms are joined to each other in a step shape. A step structure indicated by black circles is positioned one step behind the outermost surface, and is bound to a layer of the outermost surface. When SiC is viewed from the <10$\bar{1}$0> direction, the {11$\bar{2}$0} plane of SiC is indicated by one alternate long and short dot line in the right portion of FIG. 4. The number of bonding hands in a direction perpendicular to the {11$\bar{2}$0} plane of each of the Si atoms and the C atoms existing in the plane is one in one direction, as indicated by ③, which can be easily cut. When SiC is cleaved on the {11$\bar{2}$0} plane, the bonding hands are cut off along one straight line, as indicated by a broken line.

As a result, a cleavage plane appearing on the surface is a flat face at both an atomic level and a macroscopic level, whereby the cleavage plane is sufficiently applicable as the cavity facet of the semiconductor light emitting device.

A 4H—SiC crystal has a similar structure on the {10$\bar{1}$0} plane and the {11$\bar{2}$0} plane to that of the 6H—SiC crystal, and the {11$\bar{2}$0} cleavage plane has optical flatness.

In order to obtain flatness of a cavity facet of the active layer in the semiconductor light emitting device, flatness obtained by cleavage on a substrate as described above must continue to an active layer. Therefore, a nitride system semiconductor layer is epitaxially grown on the {0001} plane of the 6H—SiC or the 4H—SiC using MOCVD (metal organic chemical vapor deposition), to form a growth layer including the active layer.

Figure 5:
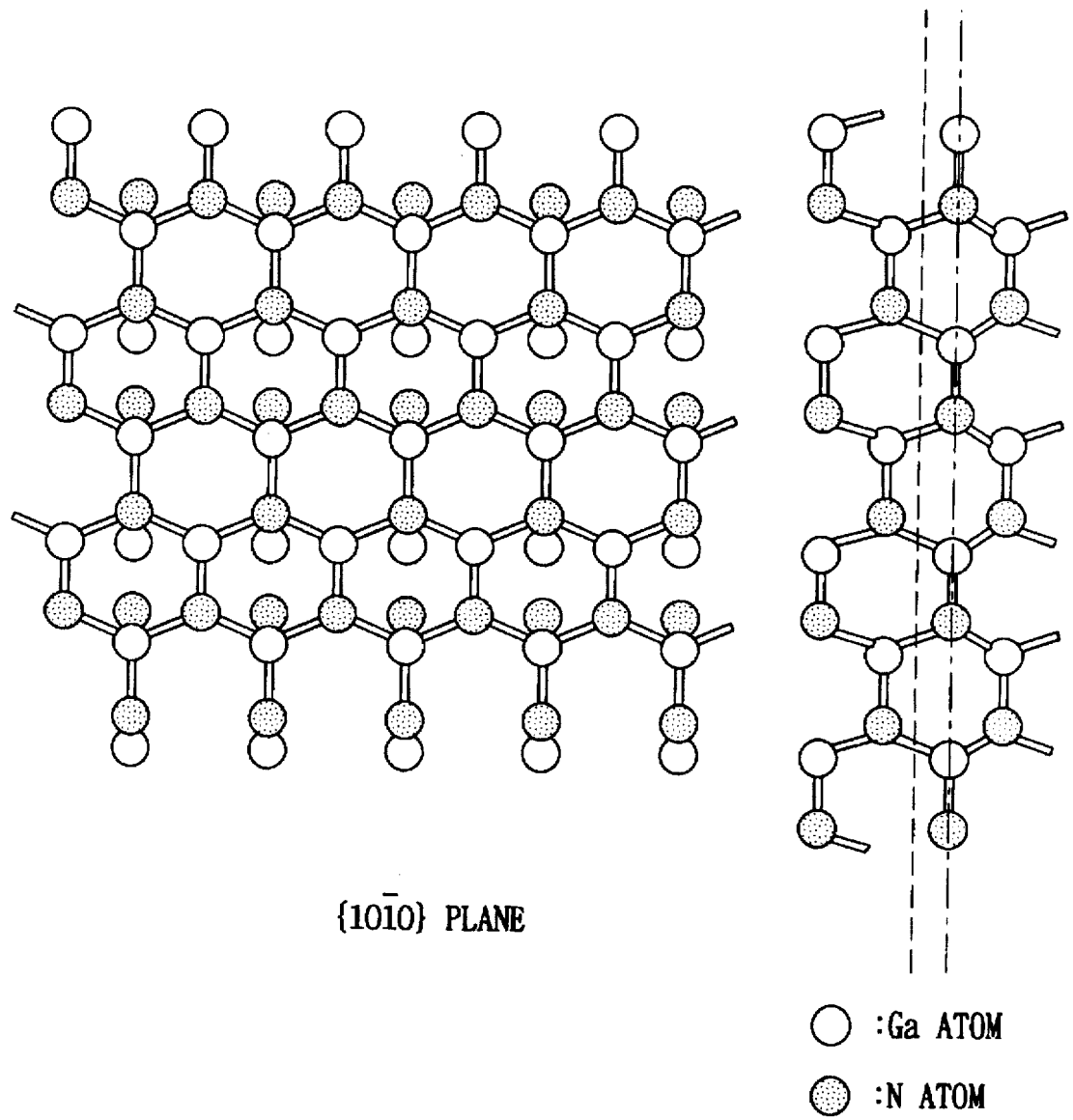
FIG. 5 is a diagram showing an atomic arrangement on a {10$\bar{1}$0} plane of a hexagonal nitride system semiconductor and an atomic arrangement as viewed from a <11$\bar{2}$0> direction.

A left portion of FIG. 5 illustrates an atomic arrangement on a {10$\bar{1}$0} plane of a hexagonal nitride system semiconductor (for example, GaN), and a right portion of FIG. 5 illustrates an atomic arrangement in a case where the hexagonal nitride system semiconductor is viewed from a <11$\bar{2}$0> direction parallel to the {10$\bar{1}$0} plane. A left portion of FIG. 6 illustrates an atomic arrangement on a {11$\bar{2}$0} plane of a hexagonal nitride system semiconductor, and a right portion of FIG. 6 illustrates an atomic arrangement in a case where the hexagonal nitride system semiconductor is viewed from a <10$\bar{1}$0> direction parallel to the {11$\bar{2}$0} plane.

Figure 6:
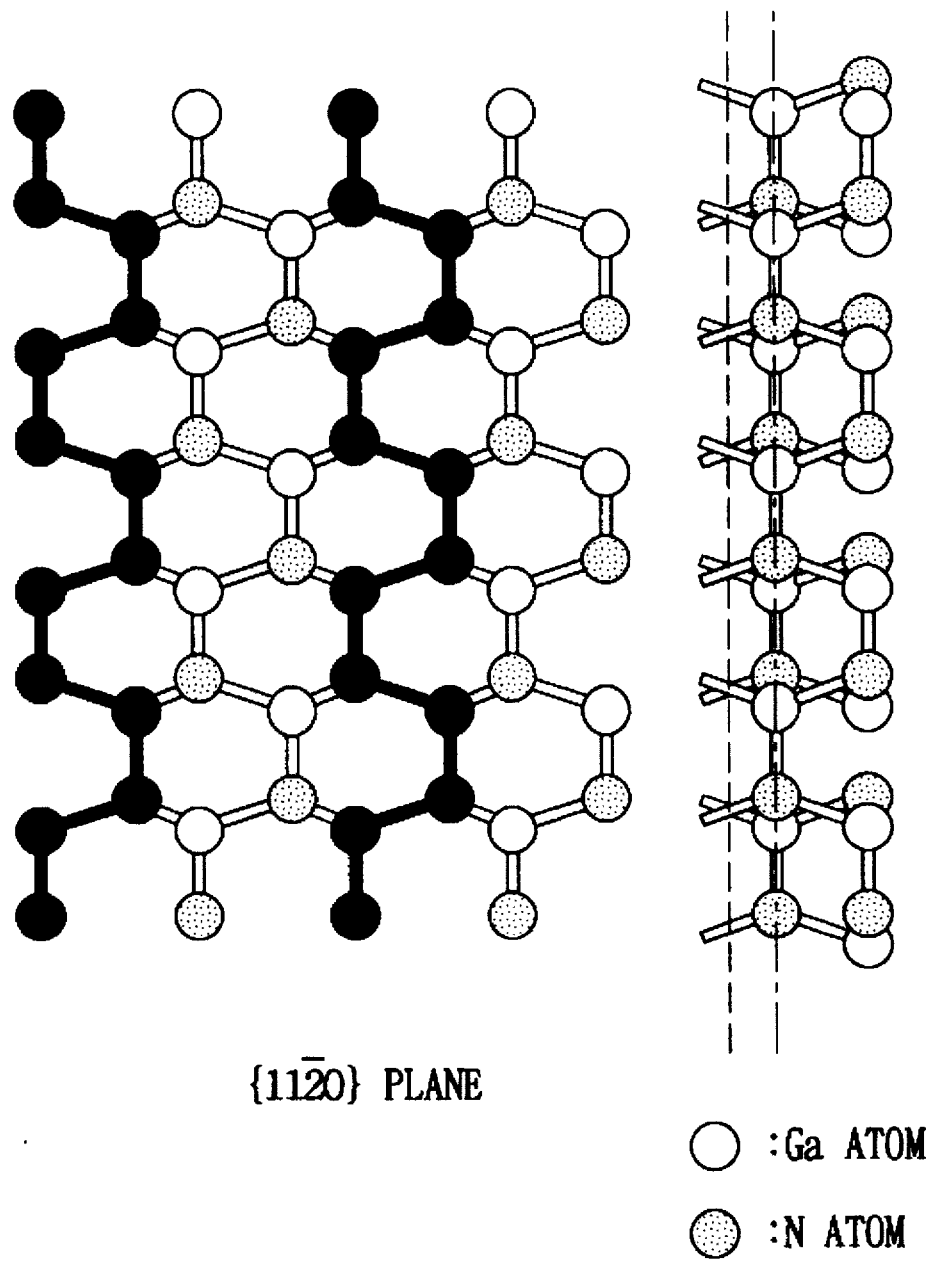
FIG. 6 is a diagram showing an atomic arrangement on a {11$\bar{2}$0} plane of a hexagonal nitride system semiconductor and an atomic arrangement as viewed from a <10$\bar{1}$0> direction.

In FIGS. 5 and 6, the {10$\bar{1}$0} plane and the {11$\bar{2}$0} plane are respectively indicated by one alternate long and short dot line. In the nitride system semiconductor, the number of bonding hands in a direction perpendicular to a plane on which atoms are aligned is one on both the {10$\bar{1}$0} plane and the {11$\bar{2}$0} plane. Consequently, an optically flat face easily appears by cleavage.

An epitaxial growth layer of a semiconductor light emitting device cannot be independently cleaved because it only has a thickness of approximately several micrometers. When an epitaxial growth layer is formed on a {0001} plane of a hexagonal SiC substrate which is superior in lattice matching, for example, a 6H—SiC substrate or a 4H—SiC substrate, after which an SiC substrate having a thickness of approximately several hundred micrometers is cleaved, the epitaxial growth layer is also continuously cleaved.

Moreover, the {11$\bar{2}$0} plane of SiC is a flat face, as can be seen from the crystalline structure. Therefore, a nitride system semiconductor light emitting device comprising a oscillation cavity is feasible by taking a device structure having the {11$\bar{2}$0} plane as a cavity facet and forming an optically flat face by cleavage.

Figure 7:
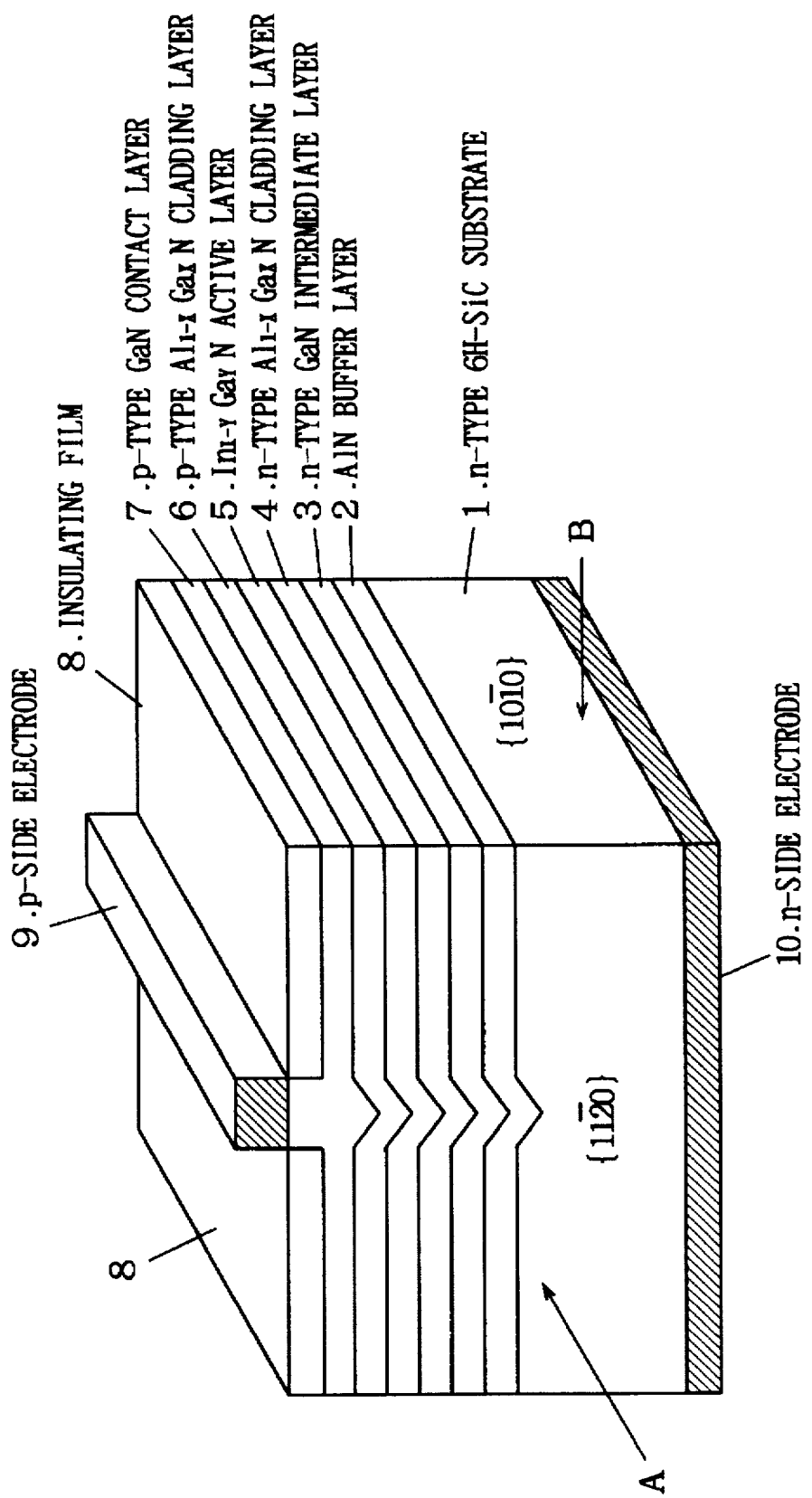
FIG. 7 is a perspective view showing the structure of a nitride system semiconductor laser device in a first embodiment of the present invention.

FIG. 7 is a perspective view showing the structure of a nitride system semiconductor laser device according to a first embodiment of the present invention.

In FIG. 7, an n-type 6H—SiC substrate 1 has a thickness of approximately 100 μm, and has a {0001} crystal growth plane. A stripe-shaped groove which is in a V shape in cross section having a width of 5 μm and a depth of 0.5 μm is formed in the center of the upper surface of the n-type 6H—SiC substrate 1.

A 300 nm thick AlN buffer layer 2 formed thinly to provide conductivity, a 3 μm thick n-type GaN intermediate layer 3, a 180 nm thick n-type Al$_{1-x}$Ga$_x$N cladding layer 4, a 60 nm thick In$_{1-y}$Ga$_y$N active layer 5, a 180 nm thick p-type Al$_{1-x}$Ga$_x$N cladding layer 6, and a 1 μm thick p-type GaN contact layer 7 are epitaxially grown successively on the {0001} Si plane of the n-type 6H—SiC substrate 1 using MOCVD. These epitaxial growth layers may be formed on a {0001} C plane of the n-type 6H—SiC substrate 1.

A composition ratio X of Ga in the n-type Al$_{1-x}$Ga$_x$N cladding layer 4 and the p-type Al$_{1-x}$Ga$_x$N cladding layer 6 is a real number in the range of $0 \leq X < 1$, and a composition ratio Y of Ga in the n-type In$_{1-y}$Ga$_y$N active layer 5 is a real number in the range of $0 \leq Y < 1$.

A region in the center of the p-type GaN contact layer 7 is formed into a stripe-shaped ridge portion having a width of 5 µm and a height of 0.3 µm by using photolithography and etching technique, and an insulating film 8 composed of $SiO_2$, SiN or the like is formed on the p-type GaN contact layer 7 on both sides of the ridge portion by evaporation method or the like. A p-side electrode 9 is formed on the ridge portion of the p-type GaN contact layer 7. In addition, an n-side electrode 10 is form on the lower surface of the n-type 6H—SiC substrate 1.

A wafer is cleaved at spacing of 300 µm along a $\{11\bar{2}0\}$ plane of the n-type 6H—SiC substrate 1 which is perpendicular to a $\{0001\}$ plane, and a stick-shaped wafer after the cleavage is cut or cleaved at a pitch of 250 µm along a $\{10\bar{1}0\}$ plane of the n-type 6H—SiC substrate which is perpendicular to a $\{11\bar{2}0\}$ plane and the $\{0001\}$ plane. Consequently, a nitride system semiconductor laser device having a cavity length of 300 µm, a width of 250 µm and a height of 120 µm is fabricated. A cavity facet A is formed of the $\{11\bar{2}0\}$ plane, and a side surface B is formed of a $\{10\bar{1}0\}$ plane. For example, the cavity facet A is formed of a $(11\bar{2}0)$ plane and the side surface B is formed of a $(1\bar{1}00)$ plane.

Consequently, the semiconductor laser device according to the present embodiment has a pair of cavity facets having optical flatness, and can generate blue light stably and efficiently.

As in the above-mentioned embodiment, a nitride system light emitting diode can be also fabricated. In this case, a facet or a side surface of the light emitting diode is composed of a $\{11\bar{2}0\}$ plane and/or $\{10\bar{1}0\}$ plane perpendicular to this plane, whereby devices on a wafer can be separated by cleavage. When the devices are separated by dicing, there occurs degradation of characteristics such as decrease in light intensity by mechanical damage. Further, a level is formed in a band gap by defects, whereby luminescent color changes. On the contrary, when the devices on the wafer are separated by cleavage, there occur no degradation of characteristics and change in the luminescent color because there is little mechanical damage.

The above-mentioned fabricating method is applicable to a light emitting diode having a single pn junction or a doublehetero structure formed by sandwiching an active layer between cladding layers. Furthermore, a single active layer taking no quantum effect or an active layer having multi or single quantum well structure is also applicable as an active layer of a light emitting diode.

Figure 8:
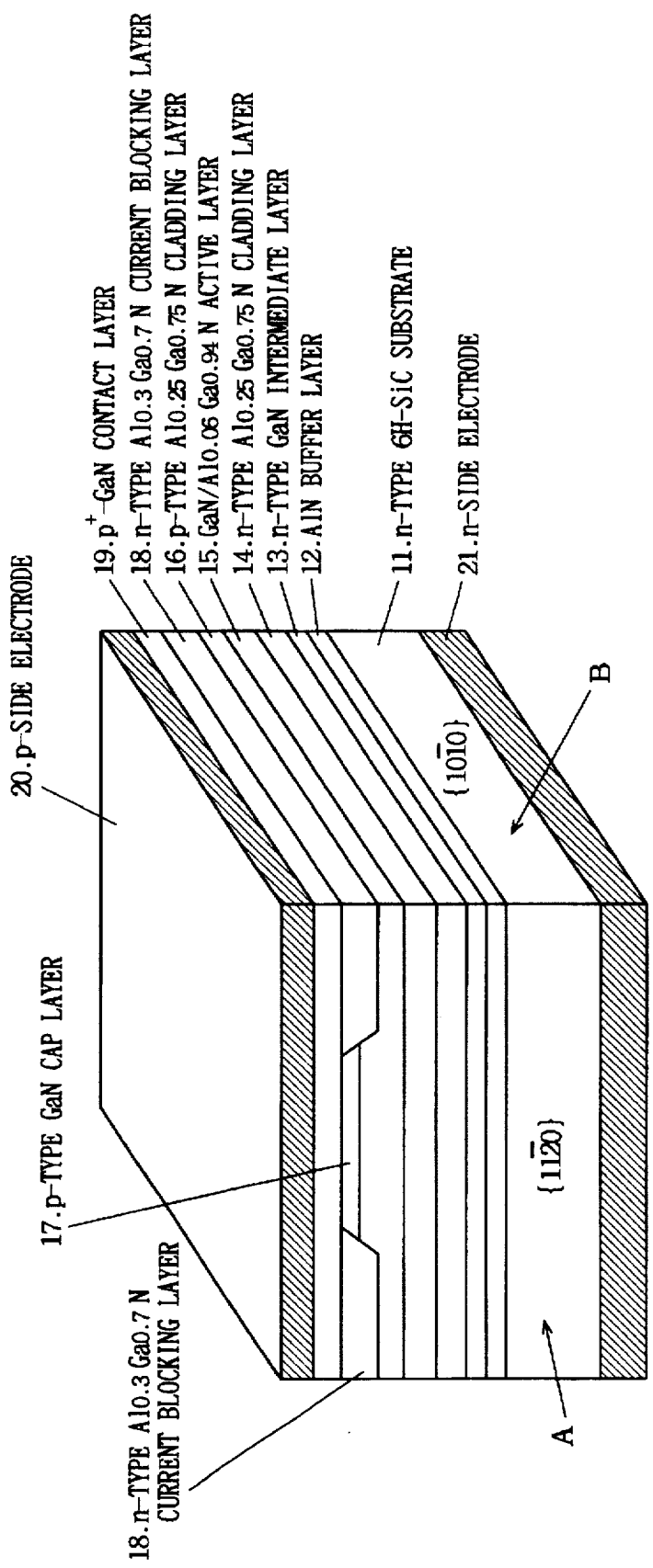
FIG. 8 is a perspective view showing the structure of a nitride system semiconductor laser device in a second embodiment of the present invention.

FIG. 8 is a perspective view showing the structure of a nitride system semiconductor laser device according to a second embodiment of the present invention.

In FIG. 8, an n-type 6H—SiC substrate 11 has a thickness of approximately 350 µm, and has a $\{0001\}$ crystal growth plane.

A 3 nm thick AlN buffer layer 12 formed thinly to provide conductivity, a 4 µm thick n-type GaN intermediate layer 13, a 1 µm thick n-type $Al_{0.25}Ga_{0.75}N$ cladding layer 14, a active layer 15 having a multi quantum well structure which is formed by alternately laminating four pairs of a 6 nm thick $Al_{0.06}Ga_{0.94}N$ quantum, barrier layer and a 3 nm thick GaN quantum well layer, a 1 µm thick p-type $Al_{0.25}Ga_{0.75}N$ cladding layer 16, and a 0.2 µm p-type GaN cap layer 17 are epitaxially grown successively on the $\{0001\}$ Si plane of the n-type 6H—SiC substrate 1 using MOCVD.

Parts of the p-type GaN cap layer 17 and the p-type $Al_{0.25}Ga_{0.75}N$ cladding layer 16 are formed in a mesa shape having a width of 5 µm and a height of 0.6 µm by photolithography and etching technique. n-type $Al_{0.3}Ga_{0.7}N$ current blocking layers 18 are epitaxially grown on both sides thereof by using MOCVD.

Furthermore, a $p^+$-GaN contact layer 19 is epitaxially grown on the surfaces of the p-type GaN cap layer 17 and the n-type $Al_{0.3}Ga_{0.7}N$ current blocking layer 18. A p-side electrode 20 is formed on the $p^+$-GaN contact layer 19, and an n-side electrode 21 is formed on the lower surface of the n-type 6H—SiC substrate.

A facet of the nitride system semiconductor laser device, that is, a cavity facet A is composed of a $\{11\bar{2}0\}$ plane formed by cleavage, and a side surface B is composed of a $\{10\bar{1}0\}$ plane formed by cleavage or cutting.

Since the cavity facet A is formed of a cleavage plane having optical flatness, therefore, the semiconductor laser device according to the present embodiment can emit laser light stably and efficiently.

In the above-mentioned first and second embodiments, a 2H—SiC substrate, a 4H—SiC substrate or a 8H—SiC substrate may be used in place of the 6H—SiC substrate.

Furthermore, an epitaxial growth layer may be formed on a (0001) plane or a plane inclined, for example less than ten and a few degrees, to a plane equivalent to the (0001) plane.

Although in the first and second embodiments the semiconductor laser devices having the single active layer and the active layer composed of a multiquantum well structure are explained, the present invention is also applicable to a semiconductor laser device having an active layer composed of a single quantum well structure.

Although in the above-mentioned first and second embodiments, description was made of a case where hexagonal SiC is used as a substrate, 3C—SiC can be also used as a substrate.

When a nitride system semiconductor is epitaxially grown on a cubic 3C—SiC substrate, the epitaxial growth layer can be of cubic system or hexagonal system according to a condition. The same effect as the above-mentioned embodiments can be obtained by using a $\{101\}$ plane of the cubic 3C—SiC substrate equivalent to a $(11\bar{2}0)$ plane of the hexagonal SiC substrate and a $\{11\bar{2}0\}$ plane of an epitaxial growth layer which is composed of a hexagonal system nitride semiconductor and epitaxially grown on the 3C—SiC substrate as a cavity facet of a semiconductor laser device or a facet or a side surface of a light emitting diode. The $\{101\}$ plane is a $(\bar{1}0\bar{1})$ plane, a $(1\bar{1}0)$ plane, a $(0\;\bar{1}\bar{1})$ plane, a $(011)$ plane, a $(110)$ plane and a $(101)$ plane.

Furthermore, the same effect as the above-mentioned embodiments can be obtained by using a $\{101\}$ plane of the cubic 3C—SiC substrate equivalent to a $(11\bar{2}0)$ plane of the hexagonal SiC substrate and a $\{101\}$ plane of an epitaxial growth layer which is composed of a cubic nitride system semiconductor and epitaxially grown on the 3C—SiC substrate as a cavity facet of a semiconductor laser device or a facet or side surface of a light emitting diode.

The epitaxial growth layer grown on the hexagonal SiC substrate, however, has more superior crystal characteristic than that grown on the cubic SiC substrate. Thus, it is preferable to use the epitaxial growth layer grown on the hexagonal SiC substrate in the semiconductor laser device or the light emitting diode.

The term "cavity facet" means a surface which substantially acts as an optical reflection surface and a surface continued therefrom.

Furthermore, in the present invention MBE (molecular beam epitaxy) method can be used as the method of forming an epitaxial growth layer on the SiC substrate in place of MOCVD.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:

a silicon carbide substrate; and an epitaxial growth layer formed on said silicon carbide substrate and composed of a nitride system semiconductor including at least one of gallium, aluminum and indium;

said semiconductor light emitting device having a pair of facets or a pair of side surfaces which is formed of a ($11\bar{2}0$) plane or a plane equivalent to said ($11\bar{2}0$) plane of said silicon carbide substrate and said epitaxial growth layer.

2. The semiconductor light emitting device according to claim 1, wherein said pair of facets or said pair of side surfaces is formed of a cleavage plane.

3. The semiconductor light emitting device according to claim 1, wherein said epitaxial growth layer is formed on a (0001) plane or a plane equivalent to said (0001) plane of said silicon carbide substrate.

4. The semiconductor light emitting device according to claim 1, wherein said silicon carbide substrate includes impurity elements for providing conductivity, further comprising:

a first electrode formed on an upper surface of said epitaxial growth layer, and a second electrode formed on a lower surface of said silicon carbide substrate.

5. The semiconductor light emitting device according to claim 1, wherein said nitride system semiconductor is composed of GaN, InN, AlN or a compound of N and one or a plurality of elements selected from a group consisting of Ga, In and Al.

6. The semiconductor light emitting device according to claim 1, wherein said silicon carbide substrate is of a hexagonal system, and the plane equivalent to said ($11\bar{2}0$) plane of said silicon carbide substrate and said epitaxial growth layer is a ($2\bar{1}\bar{1}0$) plane, a ($1\bar{2}10$) plane, a ($\bar{1}\bar{1}20$) plane, a ($\bar{2}110$) plane or a ($\bar{1}2\bar{1}0$) plane.

7. The semiconductor light emitting device according to claim 1, wherein said silicon carbide substrate is of a cubic system, and the plane equivalent to said ($11\bar{2}0$) plane of said silicon carbide substrate is a $\{101\}$ plane.

8. A semiconductor laser device comprising a silicon carbide substrate; and an epitaxial growth layer formed on said silicon carbide substrate and composed of a nitride system semiconductor including at least one of gallium, aluminum and indium, said semiconductor laser device having a pair of cavity facets which is formed of a ($11\bar{2}0$) plane or a plane equivalent to said ($11\bar{2}0$) plane of said silicon carbide substrate and said epitaxial growth layer.

9. The semiconductor laser device according to claim 8, wherein said pair of cavity facets is composed of a cleavage plane.

10. The semiconductor laser device according to claim 8, wherein said epitaxial growth layer has a pair of side surfaces which is perpendicular to said pair of cavity facets and formed of a $\{10\bar{1}0\}$ plane.

11. The semiconductor laser device according to claim 8, wherein said epitaxial growth layer is formed on a (0001) plane or a plane equivalent to said (0001) plane of said silicon carbide substrate.

12. The semiconductor laser device according to claim 8, wherein said silicon carbide substrate includes impurity elements for providing conductivity, further comprising a first electrode formed on an upper surface of said epitaxial growth layer, and a second electrode formed on a lower surface of said silicon carbide substrate.

13. The semiconductor laser device according to claim 8, wherein said nitride system semiconductor is composed of a GaN, InN, AlN or compound of N and one or a plurality of elements selected from a group consisting of Ga, In and Al.

14. The semiconductor laser device according to claim 8, wherein said silicon carbide substrate is of a hexagonal system, and the plane equivalent to said ($11\bar{2}0$) plane of said silicon carbide substrate and said epitaxial growth layer is a ($2\bar{1}\bar{1}0$) plane, a ($1\bar{2}10$) plane, a ($\bar{1}\bar{1}20$) plane, a ($\bar{2}110$) plane or a ($\bar{1}2\bar{1}0$) plane.

15. The semiconductor laser device according to claim 8, wherein said silicon carbide substrate is of a cubic system, and the plane equivalent to said ($11\bar{2}0$) plane of said silicon carbide substrate is a $\{101\}$ plane.

16. The semiconductor laser device according to claim 8, wherein said epitaxial growth layer comprises a first cladding layer, an active layer formed on said first cladding layer, and a second cladding layer formed on said active layer.

17. A method of fabricating a semiconductor light emitting device, comprises the steps of:

forming on a silicon carbide substrate an epitaxial growth layer composed of a nitride system semiconductor including at least one of gallium, aluminum and indium; and forming a pair of facets or a pair of side surfaces of said semiconductor light emitting device by cleaving said silicon carbide substrate and said epitaxial growth layer along a ($11\bar{2}0$) plane or a plane equivalent to said ($11\bar{2}0$) plane of said silicon carbide substrate.

18. The method according to claim 17, wherein said epitaxial growth layer is formed on a (0001) plane or a plane equivalent to said (0001) plane of said silicon carbide substrate.

19. The method according to claim 17, wherein said silicon carbide substrate includes impurity elements for providing conductivity, further comprising the steps of forming a first electrode on an upper surface of said epitaxial growth layer, and forming a second electrode on a lower surface of said silicon carbide substrate.

* * * * *